(12) United States Patent
Zhao et al.

(10) Patent No.: US 12,538,690 B2
(45) Date of Patent: *Jan. 27, 2026

(54) DISPLAY PANEL AND DISPLAY DEVICE

(71) Applicants:Chengdu BOE Optoelectronics Technology Co., Ltd., Sichuan Province (CN); BOE Technology Group Co., Ltd., Beijing (CN)

(72) Inventors: Erjin Zhao, Beijing (CN); Zhiliang Jiang, Beijing (CN); Jun Yan, Beijing (CN); Lingran Wang, Beijing (CN); Fan He, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/939,066

(22) Filed: Nov. 6, 2024

(65) Prior Publication Data

US 2025/0063918 A1    Feb. 20, 2025

Related U.S. Application Data

(63) Continuation of application No. 18/427,219, filed on Jan. 30, 2024, now Pat. No. 12,193,307, which is a
(Continued)

(30) Foreign Application Priority Data

Feb. 27, 2020    (WO) ................ PCT/CN2020/077041

(51) Int. Cl.
*H10K 59/40*    (2023.01)
*H10K 59/131*    (2023.01)

(52) U.S. Cl.
CPC .......... *H10K 59/40* (2023.02); *H10K 59/131* (2023.02)

(58) Field of Classification Search
CPC .... H10K 59/40; H10K 59/131; G06F 3/0412; B23K 26/382; B23K 26/384;
(Continued)

(56) References Cited

U.S. PATENT DOCUMENTS

2015/0378485 A1    12/2015    Nakamura
2016/0209965 A1    7/2016    Kim et al.
(Continued)

FOREIGN PATENT DOCUMENTS

CN    105027046 A    11/2015
CN    106997895 A    8/2017
(Continued)

OTHER PUBLICATIONS

Extended European Search Report, mailed Nov. 29, 2022, from European patent application No. 21760359.6.
(Continued)

*Primary Examiner* — Shaheda A Abdin
(74) *Attorney, Agent, or Firm* — Workman Nydegger

(57) ABSTRACT

A display panel and a display device are disclosed. The display panel includes: a touch electrode, at least located in the display region; and a touch trace, electrically connected with the touch electrode, and disposed on a side of the dam structure away from the base substrate; where the touch trace includes a first trace portion, and an orthographic projection of at least a part of the first trace portion on the base substrate overlaps with an orthographic projection of the first dam portion on the base substrate; the first trace portion comprises at least one first trace sub-portion having an average width of a first width, and at least one second
(Continued)

trace sub-portion having an average width of a second width, where the first width is less than the second width.

18 Claims, 14 Drawing Sheets

Related U.S. Application Data continuation of application No. 17/756,305, filed as application No. PCT/CN2021/077957 on Feb. 25, 2021, now Pat. No. 11,937,485.

(58) Field of Classification Search
CPC .............. B23K 26/402; B23K 2101/40; C23C 18/1653; C23C 18/1689; C23C 18/1692; C23C 18/2086; C23C 18/30; C23C 18/32; C23C 18/42; C23C 18/50; C23C 18/54; C25D 3/38; C25D 5/022; C25D 5/10; C25D 5/12; C25D 5/611; C25D 5/617; C25D 7/00; H01L 21/4846; H01L 21/4857; H01L 21/486; H01L 23/145; H01L 23/49838; H01L 23/1985; H01L 23/5383; H01L 23/5384; H01L 23/5387; G03F 7/039; G03F 7/16; G03F 7/20
See application file for complete search history.

(56) References Cited

U.S. PATENT DOCUMENTS

| | | |
|---|---|---|
| 2016/0365395 A1 | 12/2016 | Xu et al. |
| 2017/0052619 A1* | 2/2017 | Park ...................... G06F 3/0446 |
| 2017/0068363 A1* | 3/2017 | Lo ....................... G06F 3/04164 |
| 2017/0115800 A1* | 4/2017 | Lee ...................... G06F 3/0446 |
| 2018/0033831 A1 | 2/2018 | An et al. |
| 2018/0205037 A1 | 7/2018 | Kim et al. |
| 2018/0348913 A1 | 12/2018 | Lee et al. |
| 2020/0411596 A1 | 12/2020 | Guo et al. |
| 2021/0157445 A1 | 5/2021 | Lin et al. |

FOREIGN PATENT DOCUMENTS

| | | |
|---|---|---|
| CN | 107665059 A | 2/2018 |
| CN | 207182255 U | 4/2018 |
| CN | 110265459 A | 9/2019 |
| CN | 110703946 A | 1/2020 |
| CN | 112259564 A | 1/2021 |
| EP | 3438802 A1 | 2/2019 |

OTHER PUBLICATIONS

Japanese Office Action, mailed Feb. 4, 2025, from Japanese Patent Application No. 2022-530768, 8 pages.

* cited by examiner

DISPLAY PANEL AND DISPLAY DEVICE

CROSS REFERENCE TO RELATED APPLICATIONS

The present application is a continuation of U.S. patent application Ser. No. 18/427,219, filed Jan. 30, 2024, which is a continuation of U.S. patent application Ser. No. 17/756,305, filed May 20, 2022, which is a national phase entry under 35 U.S.C. § 371 of International Application No. PCT/CN2021/077957 filed on Feb. 25, 2021, which claims the priority of International Application No. PCT/CN2020/077041 filed on Feb. 27, 2020, of which the entire contents are incorporated herein by reference.

TECHNICAL FIELD

The disclosure relates to the technical field of semiconductors, in particular to a display panel and a display device.

BACKGROUND

AMOLED, short for Active-matrix organic light-emitting diode, has advantages of thinness, low power consumption, high contrast, high color gamut, flexible display and the like, and is widely applied to a display industry.

Among AMOLED products, a Flexible Multi-Layer On Cell (FMLOC) is already a trend design product. Compared with a plug-in touch screen panel (TSP), cost can be greatly reduced, an integration degree is higher, and the product is thinner and easier to fold.

However, the flexible multi-layer on cell in the prior art is prone to short circuit between adjacent touch traces, resulting in touch failure.

SUMMARY

An embodiment of the disclosure provides a display panel, including: a base substrate, having a display region and a peripheral region surrounding the display region; a dam structure, disposed on the base substrate and located in the peripheral region, surrounding the display region, and comprising a first dam portion located at at least one side of the display region; a touch electrode, at least located in the display region; and a touch trace, electrically connected with the touch electrode, and disposed on a side of the dam structure away from the base substrate. The touch trace comprises a first trace portion, and an orthographic projection of at least a part of the first trace portion on the base substrate overlaps with an orthographic projection of the first dam portion on the base substrate; the first trace portion comprises at least one first trace sub-portion having an average width of a first width, and at least one second trace sub-portion having an average width of a second width; in an extending direction of the first trace portion, a minimum distance between an orthographic projection of the first trace sub-portion on the base substrate and the orthographic projection of the first dam portion on the base substrate is less than or equal to 15 µm; and the first width is less than the second width.

In one possible implementation, a range of a ratio of the minimum distance between the orthographic projection of the first trace sub-portion on the base substrate and the orthographic projection of the first dam portion on the base substrate to a width of the first dam portion is less than 0.5 and greater than or equal to 0.

In one possible implementation, an edge of the orthographic projection of the first dam portion on the base substrate overlaps with the orthographic projection of the first trace sub-portion on the base substrate.

In one possible implementation, in a direction along the extending direction of the first trace portion, the first dam portion comprises a flat portion and slope portions located at both sides of the flat portion; and an orthographic projection of the slope portion on the base substrate overlaps with the orthographic projection of the first trace sub-portion on the base substrate.

In one possible implementation, an orthographic projection of the flat portion on the base substrate overlaps with an orthographic projection of the second trace sub-portion on the base substrate.

In one possible implementation, the second trace sub-portion comprises a first part disposed on the flat portion and a second part disposed on the slope portion, and an average width of the first part is less than an average width of the second part.

In one possible implementation, an average width of the first part is 0.8-0.95 times an average width of the second part.

In one possible implementation, the slope portions comprise a first slope sub-portion and a second slope sub-portion, and the second slope sub-portion is located at a side of the first slope sub-portion toward the flat portion; and an average slope of the first slope sub-portion is greater than an average slope of the second slope sub-portion.

In one possible implementation, the first trace sub-portion and the second trace sub-portion are alternately arranged.

In one possible implementation, a width of the first trace sub-portion in a direction perpendicular to the extending direction of the first trace portion is 0.6-0.95 times a width of the second trace sub-portion in a direction perpendicular to the extending direction of the first trace portion.

In one possible implementation, a side of the second trace sub-portion close to the first trace sub-portion has a width gradient; and the width of the second trace sub-portion gradually decreases in a direction from the second trace sub-portion to the first trace sub-portion.

In one possible implementation, a boundary of the first trace sub-portion and the second trace sub-portion substantially aligns with a boundary of the first dam portion.

In one possible implementation, a range of a ratio of a length of the first trace sub-portion to a width of the first trace sub-portion is approximate to 0.3-0.7.

In one possible implementation, a range of a ratio of a length of the first trace sub-portion to a width of the first dam portion is approximate to 0.05-0.3.

In one possible implementation, the peripheral region is further provided with fan-out data signal lines, the fan-out data signal lines are electrically connected with data lines of a pixel circuit of the display region, and an orthographic projection of the fan-out data signal lines on the base substrate overlaps with the orthographic projection of the first dam portion on the base substrate; and the orthographic projection of the fan-out data signal lines on the base substrate overlaps with the orthographic projection of the first trace portion on the base substrate.

In one possible implementation, at least part of extending directions of the fan-out data signal lines intersects extending directions of the first dam portion and the first trace portion.

In one possible implementation, the display panel comprises a plurality of circles of dam structures, and the second trace sub-portion comprises a touch line located between two adjacent dam structures of the plurality of circles of dam structures.

In one possible implementation, extending directions of the first dam portion and the first trace portion are substantially vertical.

An embodiment of the disclosure provides a display panel, including: a display region, provided with a touch electrode; a plurality of circles of dam structures, sequentially surrounding the display region, and comprising an inner circle of dam structure closest to the display region and an outer circle of dam structure farthest from the display region; and a touch trace, wherein the touch electrode is led out from the display region through the touch trace across the dam structures. The touch trace includes: a bridging portion, overlapping with the inner circle of dam structure, the outer circle of dam structure, and a region between the inner circle of dam structure and the outer circle of dam structure in a direction perpendicular to the display region; and a lead portion, connected with the bridging portion. In the direction perpendicular to the display region, the lead portion does not overlap with the dam structures, and extending directions of the lead portion and the bridging portion are substantially same; and an average width of the bridging portion at a climbing portion across at least one of the dam structures is less than an average width of the lead portion.

In one possible implementation, the display panel has the plurality of the dam structures, and a same bridging portion has a same width across climbing portions of different dam structures.

In one possible implementation, the widths of different bridging portions at the climbing portion are the same.

In one possible implementation, each bridging portion has a hollowed-out portion formed by an outer edge of the touch trace at the climbing portion being curved inward.

In one possible implementation, each bridging portion has two opposite hollowed-out portions at one climbing portion, and notches of the two hollowed-out portions are opposite to each other.

In one possible implementation, a length of the hollowed-out portion in an extending direction of the touch trace is greater than a length in a direction perpendicular to the extending direction of the touch trace.

In one possible implementation, a shape of the hollowed-out portion is a rectangle, a square, a semicircle, a semi-ellipse, a trapezoid or a triangle.

In one possible implementation, a length of the hollowed-out portion in a direction perpendicular to an extending direction of the touch trace is $1/15$ to $1/5$ of a width of the touch trace.

In one possible implementation, the length of the hollowed-out portion in the direction perpendicular to the extending direction of the touch trace is 1 μm-3 μm.

In one possible implementation, a width of the hollowed-out portion in the extending direction of the touch trace is 5 μm-15 μm.

In one possible implementation, a width of the bridging portion between the two adjacent dam structures is less than a width of the lead portion.

In one possible implementation, the average width of the bridging portion at the climbing portion across the dam structures is substantially same as an average width of the bridging portion between the two adjacent dam structures.

In one possible implementation, between the two adjacent dam structures, different bridging portions have a same width.

In one possible implementation, the bridging portion comprises an overlapping portion overlapping with an end surface of the dam structure facing away from the base substrate; and a maximum width of the overlapping portion is substantially same as a maximum width of the lead portion.

In one possible implementation, each touch trace has a cancave portion formed by an outer edge of the touch trace at a position between the two adjacent circles of dam structures curved inward.

In one possible implementation, each touch trace has the two cancave portions at the position between the two adjacent circles of dam structures, and notches of the two cancave portions are opposite to each other.

In one possible implementation, a length of the cancave portion in an extending direction of the touch trace is greater than a length in a direction perpendicular to the extending direction of the touch trace.

In one possible implementation, a shape of the cancave portion is a rectangle, a semicircle, a semi-ellipse, a trapezoid or a triangle.

In one possible implementation, the shape of the cancave portion is rectangle, and a length of the cancave portion in a direction perpendicular to an extending direction of the touch trace is $1/10$ to $1/5$ of the width of the lead portion.

In one possible implementation, a hollowed-out portion and the cancave portion communicate between the two adjacent circles of dam structures.

In one possible implementation, the display panel includes a base substrate, and a thin film transistor, a light-emitting layer and an encapsulation layer located on the base substrate in sequence, where the touch trace is disposed on a side of the encapsulation layer facing away from the light-emitting layer.

An embodiment of the disclosure provides a display device, including the display panel provided by the embodiment of the disclosure.

DETAILED DESCRIPTION

In order to make the objective, technical solutions and advantages of the embodiments of the disclosure more clear, the technical solutions of the embodiments of the disclosure will be described clearly and completely with reference to the drawings of the embodiments of the disclosure. Obviously, the described embodiments are part of the embodiments of the disclosure, but not all the embodiments. On the basis of the described embodiments of the disclosure, all other embodiments obtained by those ordinarily skilled in the art without inventive efforts fall within the protection scope of the disclosure.

Unless otherwise defined, the technical or scientific terms used in the disclosure shall have the usual meanings understood by a person of ordinary skill in the art to which the disclosure belongs. The words "first", "second" and the like used in the disclosure do not indicate any order, quantity or importance, but are only used to distinguish different components. The word "including" or "containing" and the like, means that an element or item preceding the word covers an element or item listed after the word and the equivalent thereof, without excluding other elements or items. The word "connection" or "coupling" and the like is not restricted to physical or mechanical connection, but may include electrical connection, whether direct or indirect. The words "up", "down", "left", "right" and the like are only configured to indicate the relative positional relationship. When the absolute position of the described object changes, the relative positional relationship may also change accordingly.

In order to keep the following description of the embodiments of the disclosure clear and concise, the disclosure omits detailed descriptions of well-known functions and well-known components.

Figure 1:
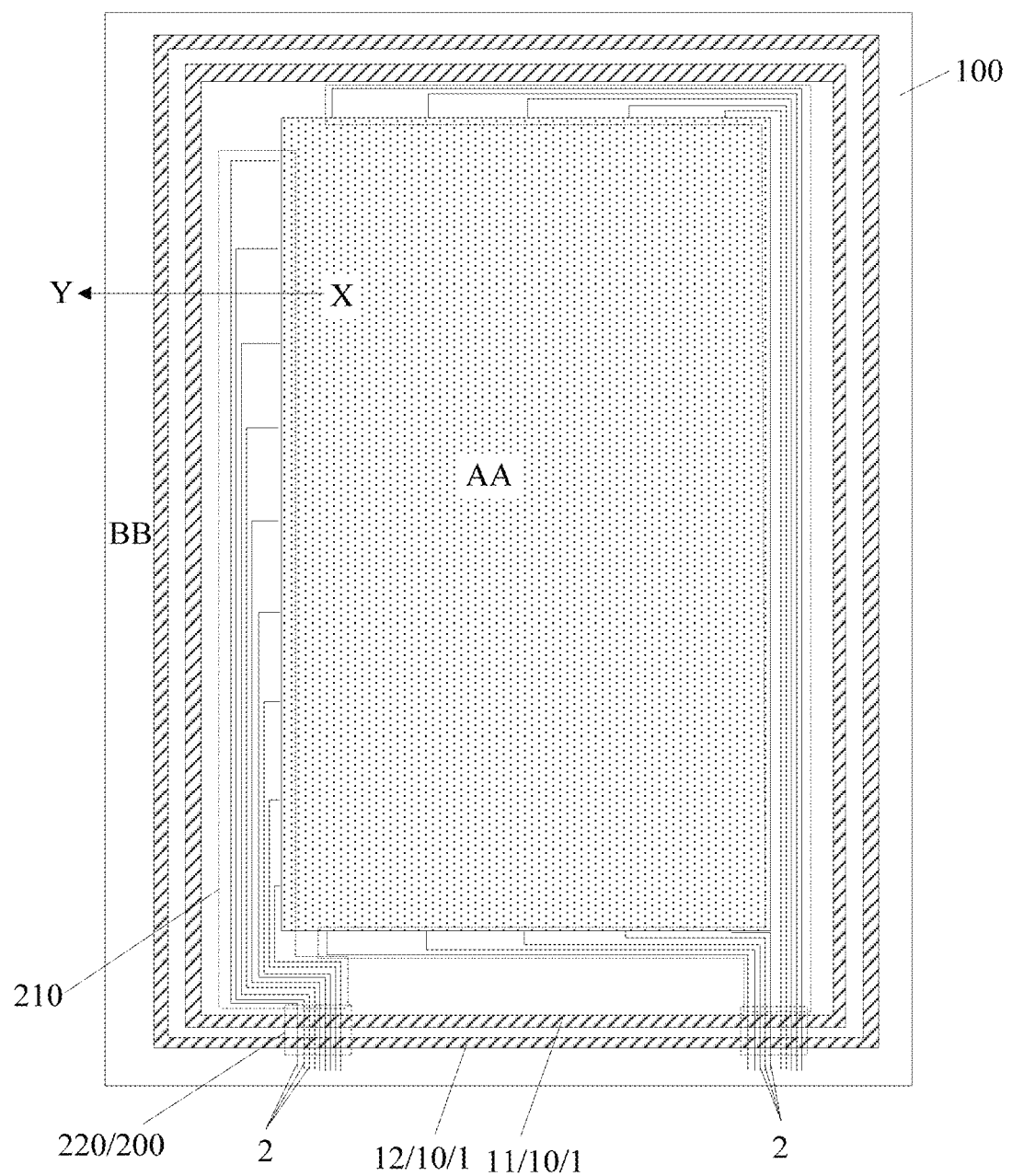
FIG. 1 is a first schematic top view of a display panel provided by an embodiment of the disclosure.
Figure 2A:
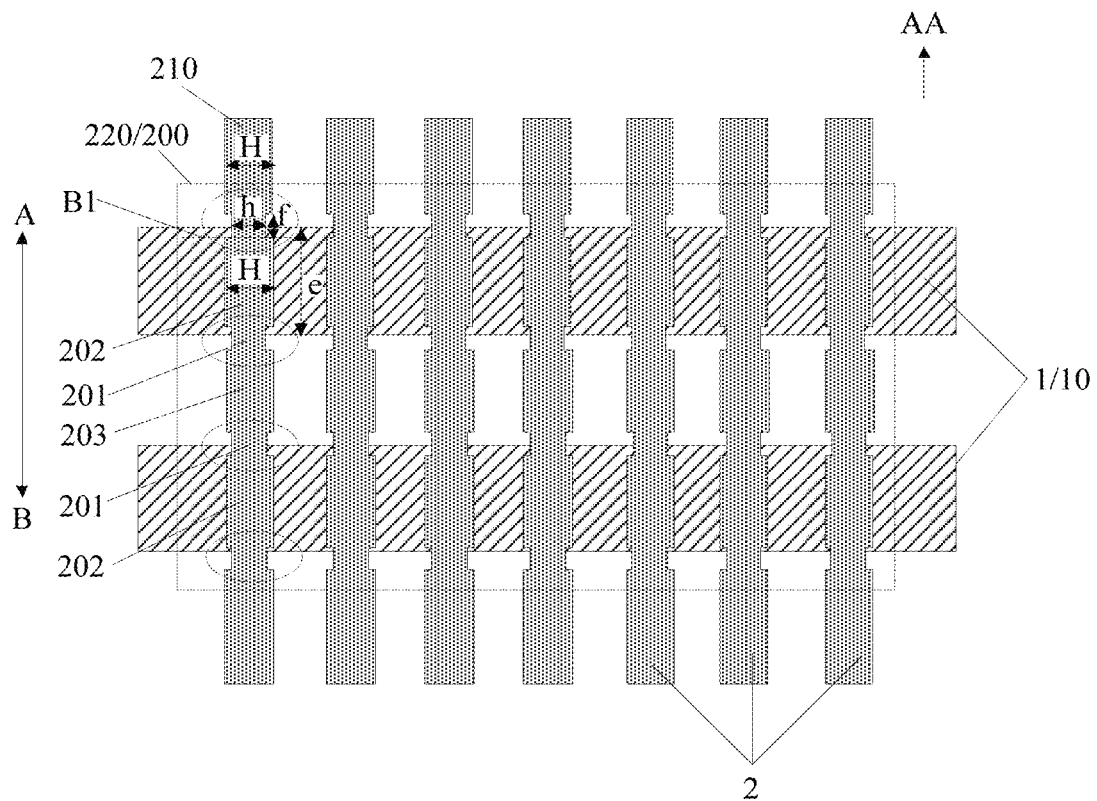
FIG. 2A is a schematic enlarged view of the structure indicated by the dotted box of FIG. 1.
Figure 2B:
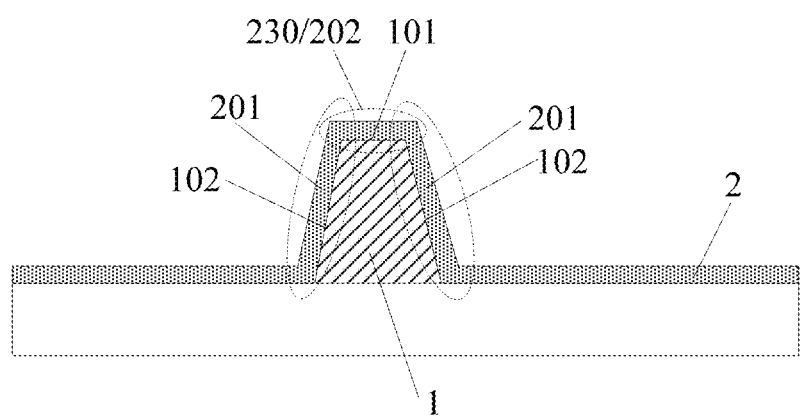
FIG. 2B is a first schematic sectional view of a first dam portion and a first trace portion provided by an embodiment of the disclosure.
Figure 3A:
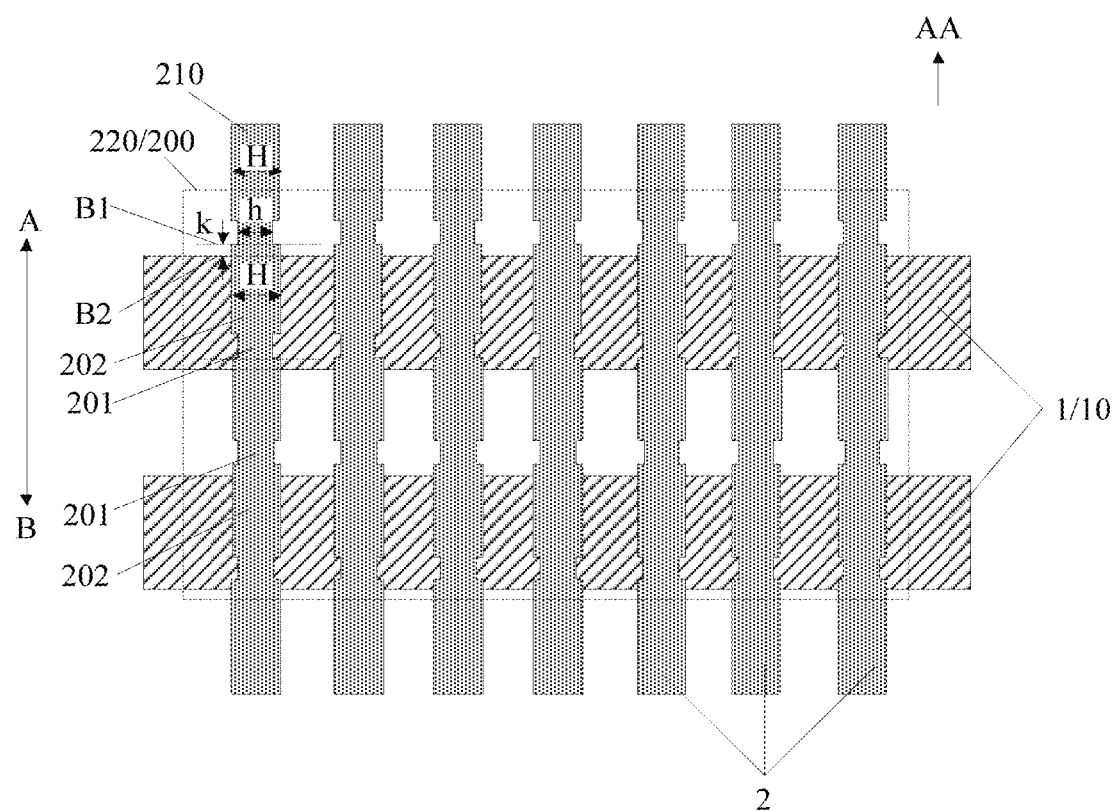
FIG. 3A is a first schematic diagram of a first trace portion provided by an embodiment of the disclosure.

Referring to FIG. 1, FIG. 2A and FIG. 2B, FIG. 2A is a schematic enlarged view of the structure in a dotted box in FIG. 1, and FIG. 2B is a schematic sectional view of the structure in a dotted circle in FIG. 2A. An embodiment of the disclosure provides a display panel, including:
  a base substrate 100, having a display region AA and a peripheral region BB surrounding the display region AA;
  a dam structure 1, located in the peripheral region BB on the base substrate 100, surrounding the display region AA, and including a first dam portion 10 located at at least one side of the display region AA;
  a touch electrode, at least located in the display region AA; and
  a touch trace(s) 2, electrically connected with the touch electrode, and on a side of the dam structure 1 away from a base substrate 100; specifically, there may include other layers between the dam structure 1 and the touch trace 2, for example, structures such as an encapsulation layer; the touch trace 2 includes a first trace portion 200, an orthographic projection of at least some of the first trace portion 200 on the base substrate 100 overlaps with an orthographic projection of the first dam portion 10 on the base substrate 100, the first trace portion 200 includes at least one first trace sub-portion 201 having an average width of a first width h, and at least one second trace sub-portion 202 having an average width of a second width H, the first width h being smaller than the second width H, and in an extending direction AB of the first trace portion 200, a minimum distance between an orthographic projection of the first trace sub-portion 201 on the base substrate 100 and the orthographic projection of the first dam portion 10 on the base substrate 100 is less than or equal to 15 μm. FIG. 2A shows that the orthographic projection of the first trace sub-portion 201 on the base substrate 100 and the orthographic projection of the first dam portion 10 on the base substrate 100 overlap, where the distance between the orthographic projection of the first trace sub-portion 201 on the base substrate 100 and the orthographic projection of the first dam portion 10 on the base substrate 100 is 0. In one possible implementation, as shown in FIG. 3A, when the orthographic projection of the first trace sub-portion 201 on the base substrate 100 does not overlap with the orthographic projection of the first dam portion 10 on the base substrate 100, the minimum distance between the orthographic projection of the first trace sub-portion 201 on the base substrate 100 and the orthographic projection of the first dam portion 10 on the base substrate 100 can be understood as a distance k between a boundary B1 of the first trace sub-portion 201 close to the first dam portion 10 and a boundary B2 of the first dam portion 10 close to the first trace sub-portion 201, and the distance k is less than or equal to 15 μm. The distance k is relatively small, which may be considered as that the width of a portion of the first trace portion 200 is reduced, and this portion may be understood as vicinity of intersection of the boundary of the first trace portion 200 and the boundary of the first dam portion 10. In one possible implementation, the distance k may be less than or equal to 5 μm. Specifically, the first width h and the second width H may be within a numerical range, for example, the first width h may be approximate to 14-16 μm, and the second width H may be 15-20 μm.

In the display panel provided by the embodiment of the disclosure, the touch trace 2 includes the first trace portion 200, the orthographic projection of at least some of the first trace portion 200 on the base substrate 100 overlaps with the orthographic projection of the first dam portion 10 on the base substrate 100, the first trace portion 200 includes the at least one first trace sub-portion 201 having the average width of the first width h, and the at least one second trace sub-portion 202 having the average width of the second width H, the first width h is less than the second width H, and the first trace sub-portion 201 and the second trace sub-portion 202 are alternately arranged. In the extending direction AB of the first trace portion 200, the minimum distance between the orthographic projection of the first trace sub-portion 201 on the base substrate 100 and the orthographic projection of the first dam portion 10 on the base substrate 100 is less than or equal to 15 μm. When the touch trace 2 enters the display region (AA) from an external circuit (such as FPC), there is a large segment difference when passing through the dam structures 1, and then when a metal film layer for forming the touch trace 2 is exposed, the dam structures 1 are prone to being subjected to photoresist (PR) residue, resulting in photoresist residue on slopes of the same-film metal lines of different signals; and after photoresist is subsequently removed, metal residue will occur, resulting in short circuit between the touch traces 2, which in turn causes the touch failure. However, in the embodiment of the disclosure, by disposing the touch trace 2 to have alternately changing the widths at the position across the dam structure 1, the space between the touch traces can be increased, the occurrence rate of the short circuit can be reduced, the yield can be improved, and a problem of touch failure due to short circuit of the adjacent touch traces of the flexible multi-layer on cell can be improved.

During specific implementation, the first trace sub-portion 201 and the second trace sub-portion 202 are alternately arranged.

In one possible implementation, a ratio range of the minimum distance between the orthographic projection of the first trace sub-portion 201 on the base substrate 100 and the orthographic projection of the first dam portion 10 on the base substrate 100 to a width of the first dam portion 10 is less than 0.5 and greater than or equal to 0.

During specific implementation, with reference to FIG. 2A, the display panel includes a plurality of circles of dam structures 1, and the second trace sub-portion 202 includes a touch line 203 located between the two adjacent dam structures 1.

During specific implementation, as shown in FIG. 2A, an edge of the orthographic projection of the first dam portion 10 on the base substrate 100 overlaps with the orthographic projection of the first trace sub-portion 201 on the base substrate 100, that is, some of the edge of the orthographic projection of the first dam portion 10 on the base substrate 100 is located within the orthographic projection of the first trace sub-portion 201 on the base substrate 100. In the embodiment of the disclosure, the edge of the orthographic projection of the first dam portion 10 on the base substrate 100 overlaps with the orthographic projection of the first trace sub-portion 201 on the base substrate 100, that is, a width reducing portion of the touch trace 2 is located at a portion beginning to intersect with the first dam portion 10, so as to improve a situation that when patterning the touch trace 2, the photoresist is easy to accumulate on a slope of the first dam portion 10, resulting in metal exposure residue at the location, and thus resulting in poor short circuit.

Figure 3B:
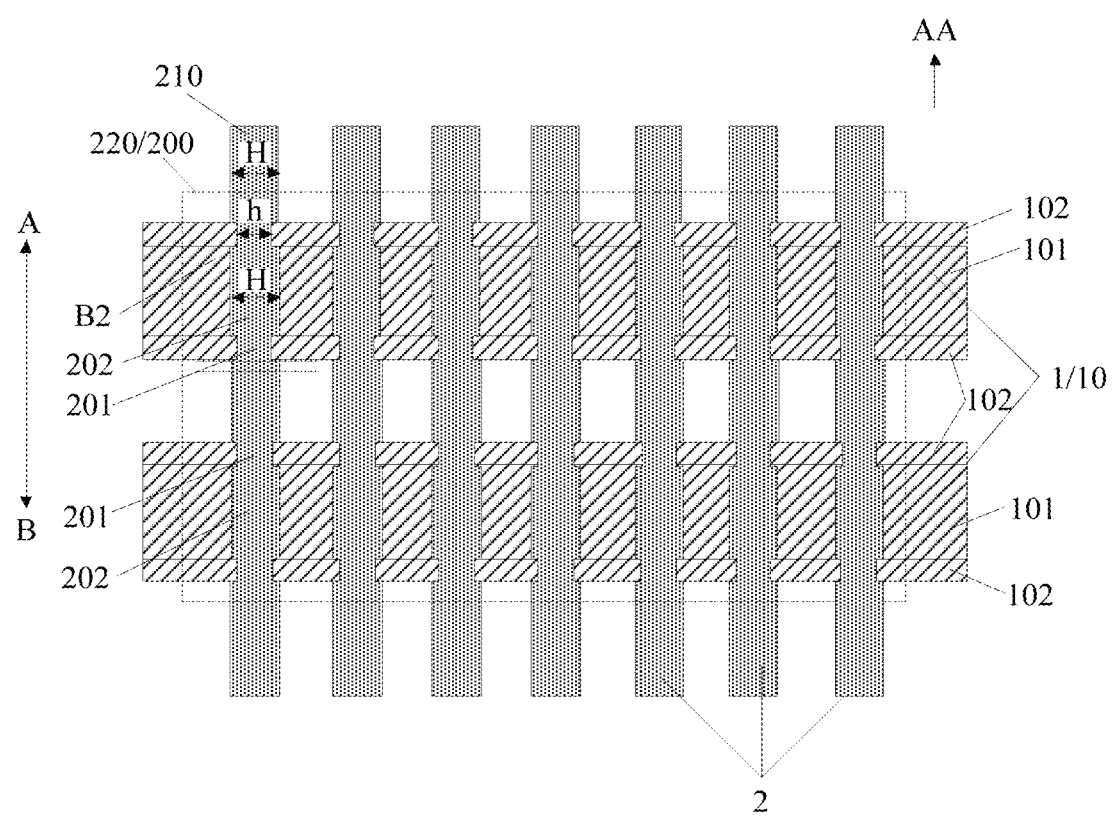
FIG. 3B is a second schematic diagram of a first trace portion provided by an embodiment of the disclosure.

During specific implementation, with reference to in FIG. 2B and FIG. 3B, the first dam portion 10 includes a flat portion 101 and slope portions 102 located at both sides of the flat portion 101 in an extending direction (i.e., the extending direction AB of the first trace portion 200) of the first trace portion 200; and an orthographic projection of the slope portions 102 on the base substrate 100 overlaps with the orthographic projection of the first trace sub-portion 201 on the base substrate 100. An orthographic projection of the flat portion 101 on the base substrate 100 overlaps with an orthographic projection of the second trace sub-portion 202 on the base substrate 100. In the embodiment of the disclosure, the orthographic projection of the slope portions 102 on the base substrate 100 overlaps with the orthographic projection of the first trace sub-portion 201 on the base substrate 100, that is, the width of the touch trace 2 at the slope of the first dam portion 10 is reduced to avoid a situation that the photoresist is easy to accumulate on the slope, resulting in metal exposure residue at the location, and thus resulting in poor short circuit.

Figure 3C:
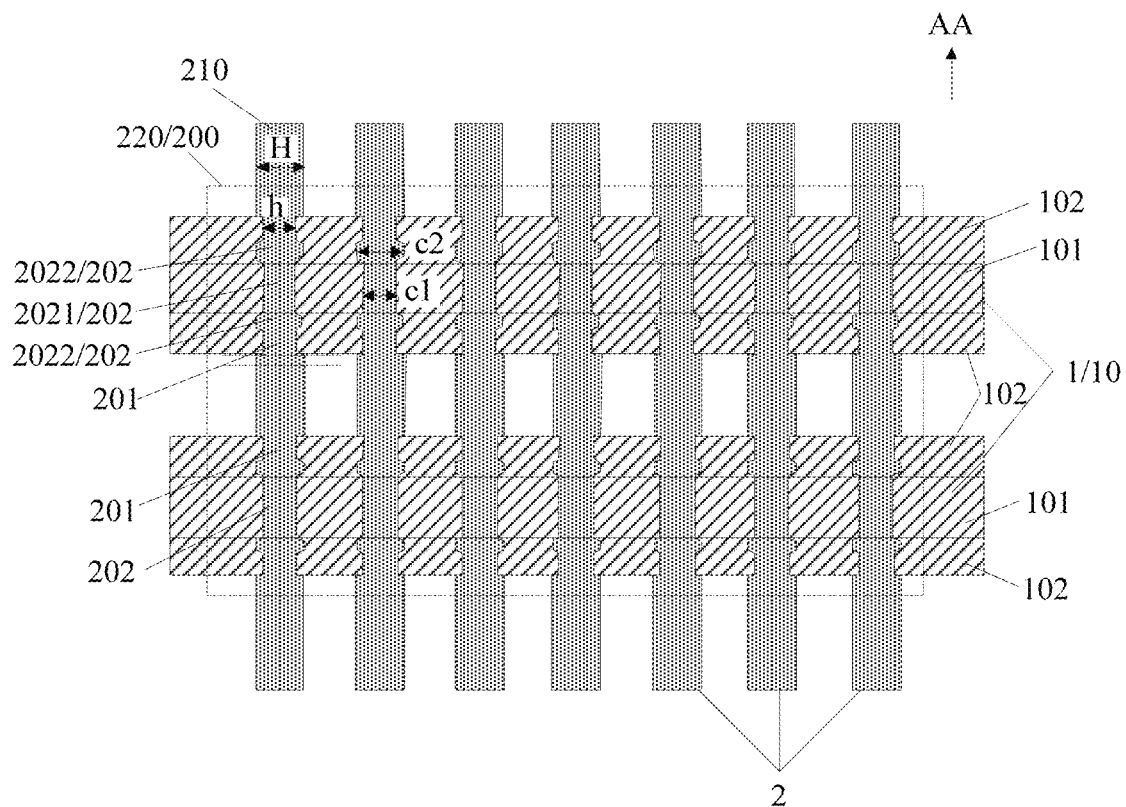
FIG. 3C is a third schematic diagram of a first trace portion provided by an embodiment of the disclosure.

In one possible implementation, as shown in FIG. 3C, the second trace sub-portion 202 includes a first part 2021 on the flat portion 101 and a second part 2022 on the slope portions 102, and an average width c1 of the first part 2021 is less than an average width c2 of the second part 2022. Specifically, the average width c1 of the first part 2021 is 0.8-0.95 times the average width c2 of the second part 2022.

Figure 3D:
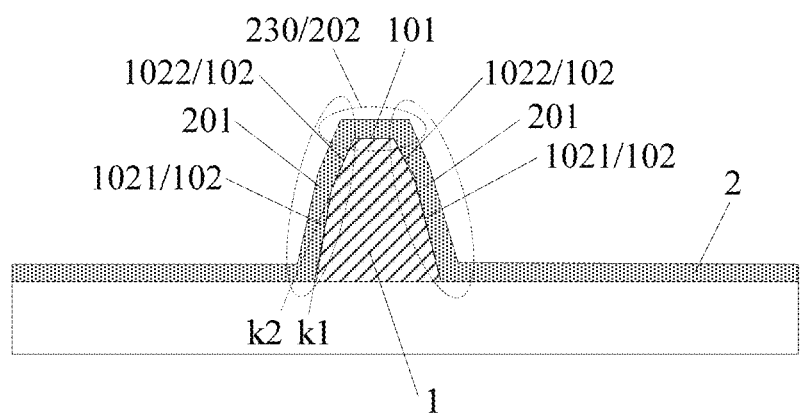
FIG. 3D is a first schematic sectional view of a first dam portion and a first trace portion provided by an embodiment of the disclosure.

During specific implementation, as shown in FIG. 3D, the slope portions 102 include a first slope sub-portion 1021 and a second slope sub-portion 1022, and the second slope sub-portion 1022 is located at a side of the first slope sub-portion 1021 towards the flat portion 101; and an average slope k1 of the first slope sub-portion 1021 is greater than an average slope k2 of the second slope sub-portion 1022.

Figure 3E:
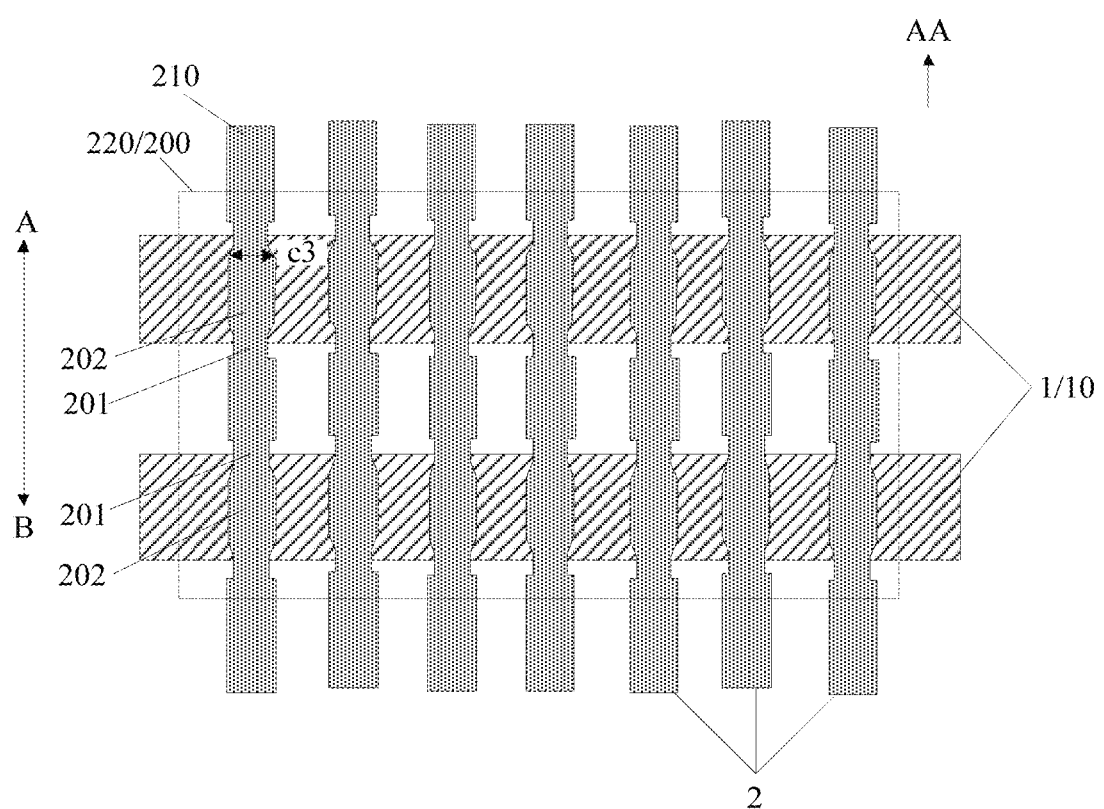
FIG. 3E is a fourth schematic diagram of a first trace portion provided by an embodiment of the disclosure.

In one possible implementation, referring to FIG. 3E, a side of the second trace sub-portion 202 close to the first trace sub-portion 201 has a width gradient, and the width c3 of the second trace sub-portion 202 gradually decreases in a direction from the second trace sub-portion 202 to the first trace sub-portion 201.

Figure 3F:
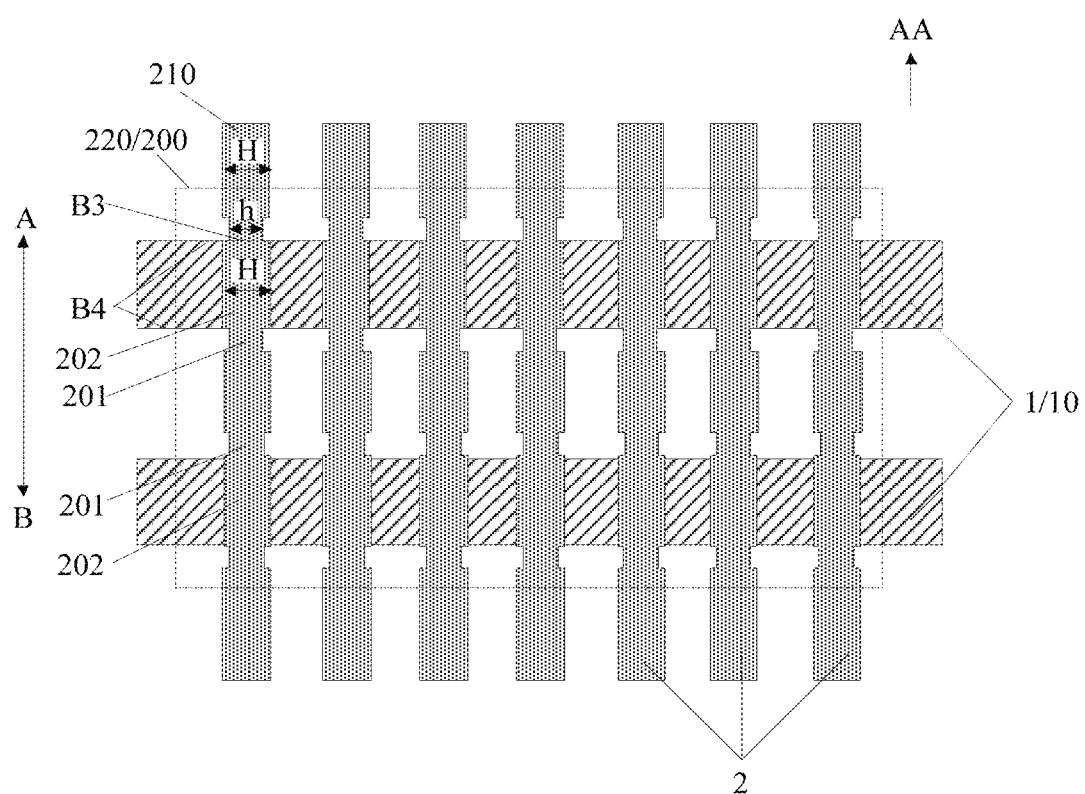
FIG. 3F is a fifth schematic diagram of a first trace portion provided by an embodiment of the disclosure.

In one possible implementation, referring to FIG. 3F, a boundary B3 of the first trace sub-portion 201 and the second trace sub-portion 202 is substantially align with a boundary B4 of the first dam portion 10. Specifically, the substantially flush range, for example, may be 0-1 μm.

During specific implementation, with reference to FIG. 2A, a width of the first trace sub-portion 201 in a direction perpendicular to the extending direction AB of the first trace portion 200 is 0.6-0.95 times a width of the second trace sub-portion 202 in the direction perpendicular to the extending direction AB of the first trace portion 200.

During specific implementation, with reference to FIG. 2A, a ratio range of a length f to the width h of the first trace sub-portion 201 is approximate to 0.3-0.7.

During specific implementation, with reference to FIG. 2A, a ratio range of the length f of the first trace sub-portion 201 to a width e of the first dam portion 10 is approximate to 0.05-0.3.

Figure 3G:
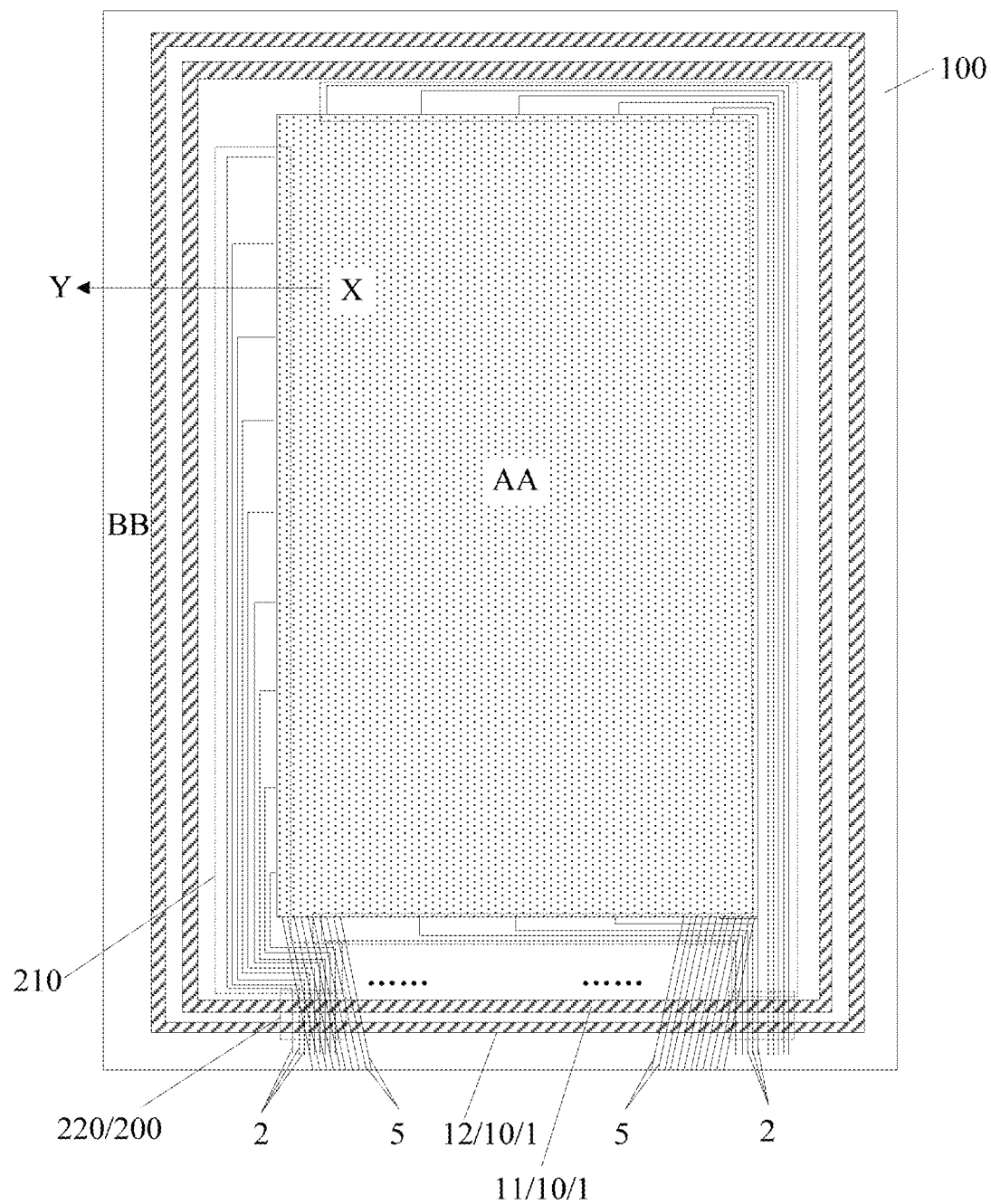
FIG. 3G is a second schematic top view of a display panel provided by an embodiment of the disclosure.

During specific implementation, with reference to FIG. 3G, the peripheral region BB further includes a fan-out data signal line 5, the fan-out data signal line 5 is electrically connected with a data line (not shown in the figure) of a pixel circuit of the display region AA, and an orthographic projection of the fan-out data signal line 5 on the base substrate 100 overlaps with the orthographic projection of the first dam portion 10 on the base substrate 100; and the orthographic projection of the fan-out data signal line 5 on the base substrate 100 overlaps with the orthographic projection of the first trace portion 200 on the base substrate 100. Specifically, at least part of an extending direction of the fan-out data signal line 5 intersects extending directions of the first dam portion 10 and the first trace portion 200. Specifically, the fan-out data signal line 5 and the touch trace 2 may be located in different layers, and are insulated from each other.

During specific implementation, the extending directions of the first dam portion 10 and the first trace portion 200 are substantially vertical.

Referring to FIG. 1, FIG. 2A and FIG. 2B, FIG. 2A is a schematic enlarged view of the structure in a dotted box in FIG. 1, and FIG. 2B is a schematic sectional view of the structure in a dotted circle in FIG. 2A. An embodiment of the disclosure provides a display panel, including:

the display region AA, with a touch electrode (not shown in the figure) provided therein; specifically, the display panel may further include a peripheral region BB surrounding the display region AA;

a plurality of circles of dam structures 1, sequentially surrounding the display region AA, and including the inner circle of dam structure 11 closest to the display region AA and the outer circle of dam structure 12 farthest from the display region AA; specifically, distances between the dam structures 1 and the display region AA may be understood as the distance between all the dam structures 1 and an outer edge of the display region AA in an extending direction (for example, a direction indicated by an arrow XY in FIG. 1) parallel to a display surface of the display panel and perpendicular to the dam structures 1; it should be noted that FIG. 1 is only a schematic illustration of the display panel having two circles of dam structures 1 as an example; and during specific implementation, the display panel may further have other numbers of dam structures 1, for example, three circles, four circles, five circles, which are not limited to this in the embodiments of the disclosure; and a touch trace 2, where the touch electrode 1 is led out from the display region AA through the touch trace 2 across the dam structures 1, and the touch trace 2 includes: a bridging portion 220, overlapping with the inner circle of dam structure 11, the outer circle of dam structure 12, and a region between the inner circle of dam structure 11 and the outer circle of dam structure 12 in a direction perpendicular to the display region AA, and a lead portion 210, connected with the bridging portion 220, where in the direction perpendicular to the display region AA, the lead portion 210 does not overlap with the dam structures 1, and extending directions of the lead portion 210 and the bridging portion 220 are roughly the same; and an average width h of the bridging portion 220 at a climbing portion across the at least one dam structure 1 is less than an average width H of the lead portion 210. The width of the bridging portion 220 and the width of the lead portion 210 may be understood as the width in a direction parallel to the display surface and perpendicular to the extending direction of the touch trace 2. Specifically, with reference to FIG. 2B, the climbing portion may be understood as an area tending upward from bottom to top of the dam structures 1.

The display panel provided by the embodiment of the disclosure has the display region and the dam structures surrounding the display region, the display region is provided therein the touch electrode, and the touch electrode is led out from the display region through the touch trace across the dam structures. The width h of the bridging portion 220 at the climbing portion across the dam structure 1 is less than the width H of the lead portion 210. That is, because when the touch trace enters the display region (AA) from an external circuit (such as FPC), there is a large segment difference when passing through the dam structure (Dam), and then when a metal film layer for forming the touch trace is exposed, a slope of the dam structure is prone to being subjected to photoresist (PR) residue, resulting in photoresist residue on slopes of the same-film metal lines of different signals; and after photoresist is subsequently removed, metal residue will occur, resulting in short circuit between the touch traces, which in turn causes the touch failure. However, in the embodiment of the disclosure, by reducing the width of the touch trace at the climbing portion across the dam structure, the space between the touch traces at the climbing portion can be increased, the occurrence rate of the short circuit can be reduced, the yield can be improved, and a problem of touch failure due to short circuit of the adjacent touch traces of the flexible multi-layer on cell can be improved.

During specific implementation, the display panel in the embodiment of the disclosure may be an FMLOC display panel. That is, after an encapsulation layer for encapsulating an organic light-emitting device of the display panel is manufactured, a touch film layer is directly manufactured thereon, and touch and display are integrated on the same panel. Specifically, as shown in FIG. 1, the touch electrode may be led out through the dam structure 1 of a frame (for example, a lower frame) at one side of the display panel, and the touch trace 2 outside the dam structure 1 may be led out to a flexible printed circuit (FPC).

It should be noted that the dam structure in the embodiment of the disclosure may be the dam structure for blocking flow of an organic encapsulation material in the encapsulation layer in an encapsulation process.

During specific implementation, the display panel has the plurality of dam structures 1, and the same bridging portion 220 has the same width at the climbing portions across the different dam structures 1. That is, with reference to FIG. 4, for example, the display panel has the two circles of dam structures 1. Each bridging portion 220 needs to pass through a first climbing portion A1, a second climbing portion A2, a third climbing portion A3 and a fourth climbing portion A4 when passing through the two circles of dam structures 1 outward from the display region AA, and a width h11 at the first climbing portion A1, a width h12 at the second climbing portion A2, a width h13 at the third climbing portion A3, and a width h14 at the fourth climbing portion A4, namely h11, h12, h13, and h14 are all the same. In the embodiment of the disclosure, the same bridging portion 220 has the same width at the climbing portions across the different dam structures, which is beneficial to reduce difficulty of manufacturing the touch trace in the embodiment of the disclosure.

During specific implementation, the widths of the different bridging portions 220 at the climbing portion are the same. That is, for example, with reference to FIG. 4, a width h21 of the second bridging portion 220 from the left at the climbing portion is the same as a width h11 of the first bridging portion 220 from the left at the climbing portion. In the embodiment of the disclosure, the widths of the different touch traces 2 at the climbing portion are the same, which is beneficial to reduce the difficulty of manufacturing the touch trace 2 in the embodiment of the disclosure, and meanwhile avoids a problem of different touch signals provided to the display panel due to the different widths of the touch traces 2.

Figure 4:
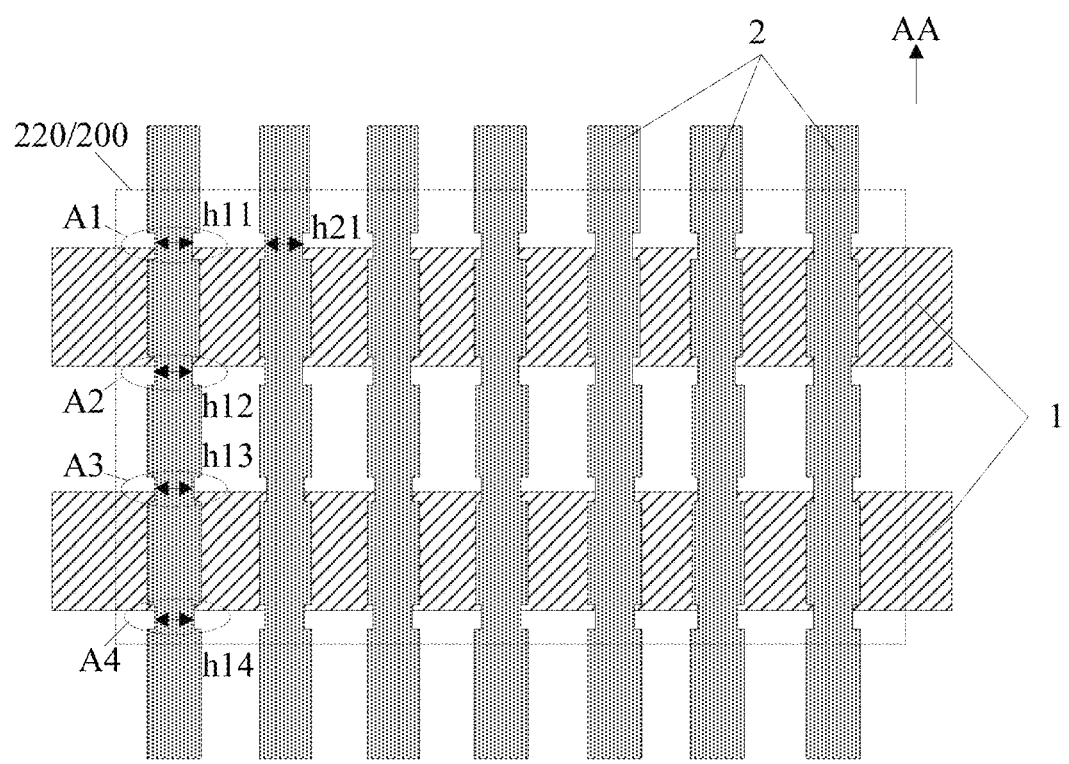
FIG. 4 is a schematic diagram illustrating the same touch trace having the same width at different climbing portions provided by an embodiment of the disclosure.
Figure 5:
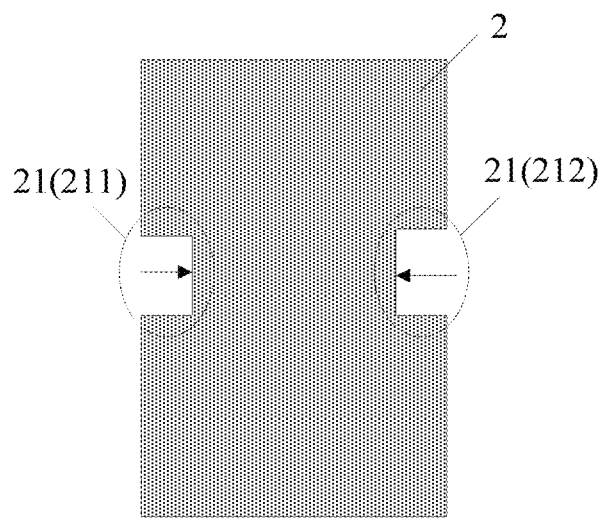
FIG. 5 is a schematic diagram of a hollowed-out portion provided by an embodiment of the disclosure.

During specific implementation, with reference to FIG. 2A, FIG. 4 and FIG. 5, each bridging portion 220 has an outer edge at the climbing portion curved inside to form a hollowed-out portion 21 (as shown by an arrow in FIG. 5). Specifically, each bridging portion 220 has two opposite hollowed-out portions 21 at one climbing portion, and notches of the two hollowed-out portions 21 are opposite to each other. That is, for example, with reference to FIG. 5, the first bridging portion 220 has a first hollowed-out portion 211 and a second hollowed-out portion 212 at a climbing portion A1, and a notch of the first hollowed-out portion 211 and a notch of the second hollowed-out portion 212 are opposite to each other.

Figure 6:
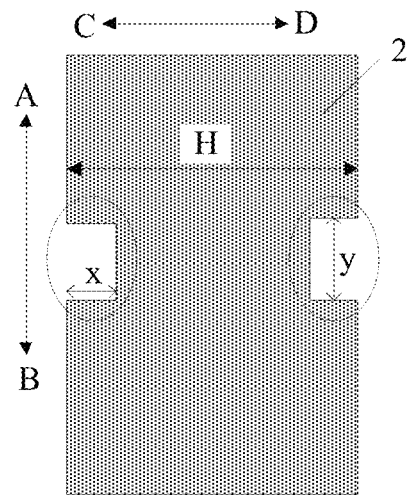
FIG. 6 is a schematic diagram illustrating different widths in different extending directions of the hollowed-out portion according to an embodiment of the disclosure.

During specific implementation, with reference to FIG. 6, a length y of each hollowed-out portion 21 in an extending direction AB of the touch trace is greater than a length x in a direction perpendicular to the extending direction (namely, a direction indicated by an arrow CD) of the touch trace 2. In the embodiment of the disclosure, since the direction y is a direction in which the touch trace 2 climbs through the dam structure 1, the direction x is a direction in which the different touch traces 2 are easily short-circuited. Length y is set to be large because the touch trace 2 has a long slope at the climbing portion, and the direction x cannot be too large, because a line width of the touch trace 2 is small, if x is large, sudden change of resistance will be caused.

Figure 7:
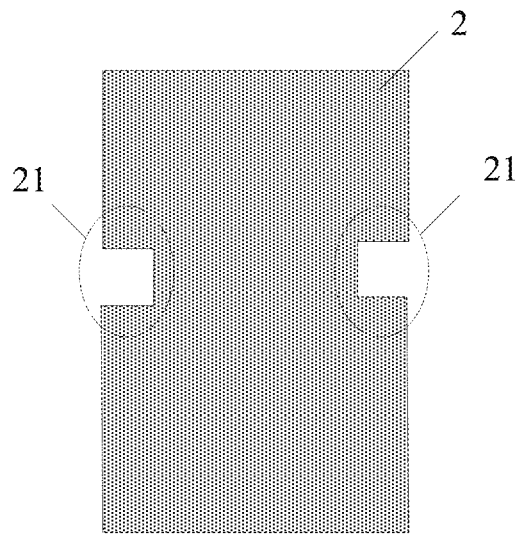
FIG. 7 is a schematic diagram of a hollowed-out portion being a square provided by an embodiment of the disclosure.
Figure 8:
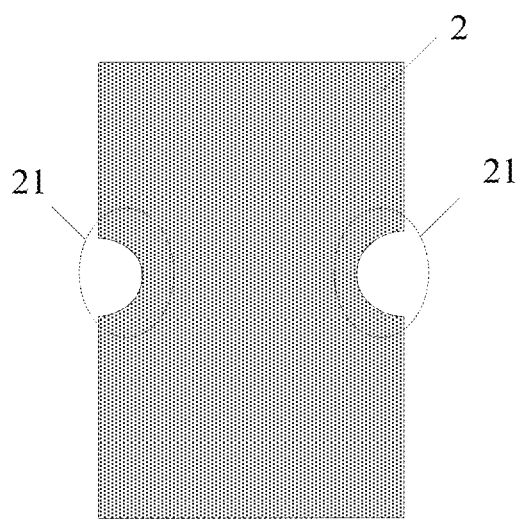
FIG. 8 is a schematic diagram of a hollowed-out portion being a semicircle provided by an embodiment of the disclosure.
Figure 9:
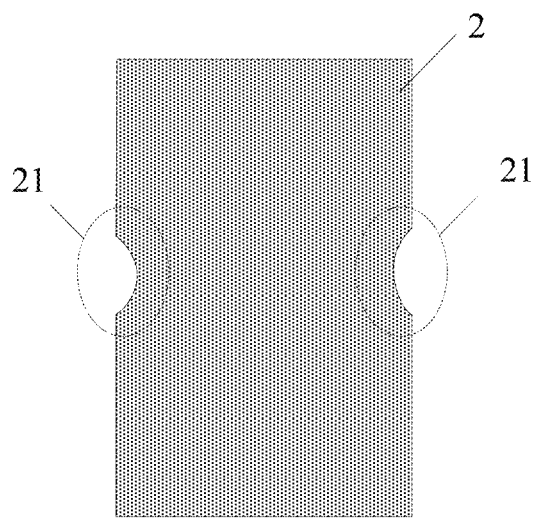
FIG. 9 is a schematic diagram of a hollowed-out portion being a semi-ellipse provided by an embodiment of the disclosure.
Figure 10A:
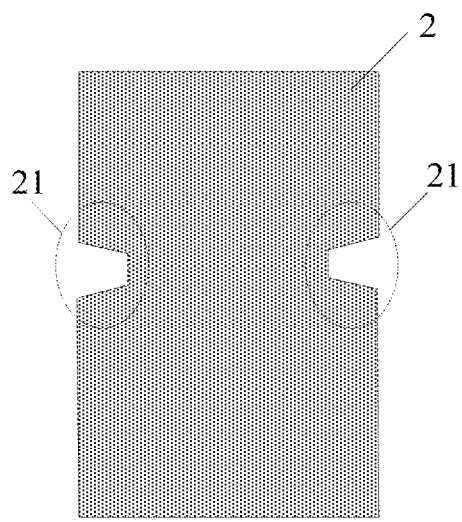
FIG. 10A is a schematic diagram of a hollowed-out portion being a trapezoid provided by an embodiment of the disclosure.
Figure 10B:
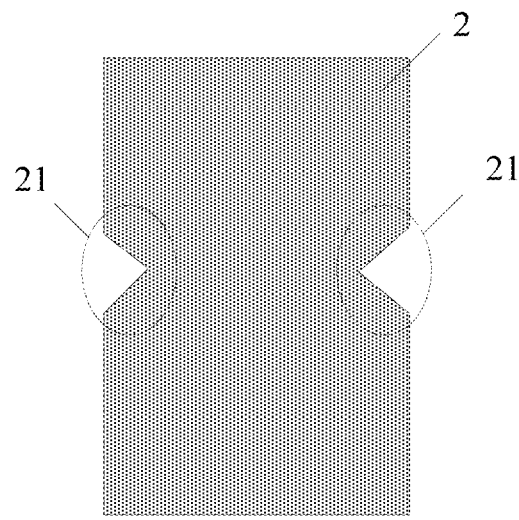
FIG. 10B is a schematic diagram of a hollowed-out portion being a triangle provided by an embodiment of the disclosure.

During specific implementation, a shape of the hollowed-out portion 21 is a rectangle, as shown in FIG. 5 or FIG. 6; the shape of the hollowed-out portion 21 may also be a square, as shown in FIG. 7; the shape of the hollowed-out portion 21 may also be a semicircle, as shown in FIG. 8; the shape of the hollowed-out portion 21 may also be a semi-ellipse, as shown in FIG. 9; the shape of the hollowed-out portion 21 may also be a trapezoid, as shown in FIG. 10A; and the shape of the hollowed-out portion 21 may also be a triangle, as shown in FIG. 10B. Of course, it may be understood that the rectangle, square, semicircle, semi-ellipse, trapezoid, and triangle described above may also be an approximate rectangle, an approximate square, an approximate semicircle, an approximate semi-ellipse, and an approximate triangle in consideration of process error of manufacturing during practical manufacturing.

During specific implementation, with reference to FIG. 6, the shape of the hollowed-out portion 21 is the rectangle. A length x of the hollowed-out portion 21 in a direction perpendicular to the extending direction AB of the touch trace 2 is $1/15$ to $1/5$ of a width H of the touch trace 2. Specifically, the length x of the hollowed-out portion 21 in the direction perpendicular to the extending direction AB of the touch trace 2 is $1/10$ to $1/5$ of the width H of the touch trace 2. In the embodiment of the disclosure, the length x of the hollowed-out portion 21 in the direction perpendicular to the extending direction AB of the touch trace 2 is $1/10$ to $1/5$ of the width H of the touch trace 2, which can improve the problem of short circuit prone to being occurring at the climbing portion, and can also avoid the influence on a signal transmission capability of the touch trace itself when the line width of the touch trace is too narrow.

During specific implementation, with reference to FIG. 6, the length x of the hollowed-out portion 21 in the direction perpendicular to the extending direction AB of the touch trace 2 is 1 μm-3 μm, specifically, for example, may be 2.6 μm. The width y of the hollowed-out portion 21 in the extending direction AB of the touch trace 2 is 5 μm-15 μm, specifically, for example, may be 7 μm.

During specific implementation, the touch trace 2 may only reduce the width at the climbing portion, as shown in FIG. 2A and FIG. 4. That is, the width h of the touch trace 2 at the climbing portion across the dam structure 1 is less than the width H of the touch trace 2 at other positions, and the other positions may specifically be the widths of the touch trace 2 at positions other than the climbing portion.

Figure 11:
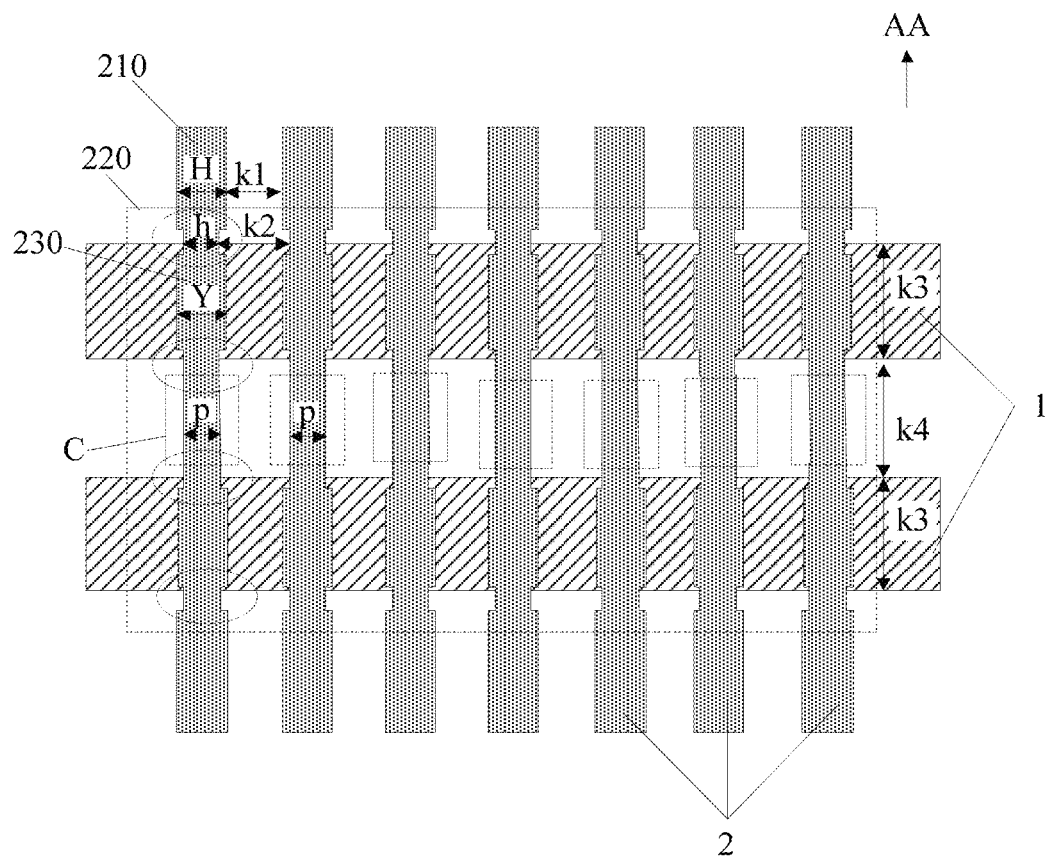
FIG. 11 is a schematic structural diagram of another touch trace structure provided by an embodiment of the disclosure.

During specific implementation, as shown in FIG. 11, the touch trace 2 may further reduce the width of the bridging portion 220 between the two adjacent dam structures 1 (such as a region indicated by a rectangular box C in FIG. 11) in addition to reducing the width at the climbing portion, that is, the width p of the bridging portion 220 between the two adjacent dam structures 1 is less than the width H of the lead portion 210. Since the distance between the two adjacent dam structures 1 is small, and a gap between the two adjacent touch traces 2 is also small, the traces space is limited. In an embodiment of the disclosure, the touch trace 2 may further reduce the width of the bridging portion 220 between the two adjacent dam structures 1 in addition to reducing the width at the climbing portion, which can further improve a risk of short circuit of the touch trace 2 due to photoresist residue between the adjacent dam structures 1.

During specific implementation, with reference to FIG. 11, the average width h of the bridging portion 220 at the climbing portion across the dam structures 1 is substantially the same as the average width p of the bridging portion 220 between the two adjacent dam structures 1. In the embodiment of the disclosure, the width h of the bridging portion 220 at the climbing portion across the dam structures 1 is the same as the width p of the bridging portion 220 between the two adjacent dam structures 1, which can simplify a manufacturing process of the touch trace 2, and reduce a manufacturing cost of the display panel.

During specific implementation, the different bridging portions 220 have the same width between the two adjacent dam structures 1. For example, with reference to FIG. 11, the width p of the first bridging portion 220 from the left between the two adjacent dam structures 1 is the same as the width p of the second bridging portion 220 from the left between the two adjacent dam structures 1. In the embodiment of the disclosure, the different bridging portions 220 have the same width between the two adjacent dam structures 1, which can simplify the manufacturing process of the touch trace 1 and reduce the manufacturing cost of the display panel.

During specific implementation, with reference to FIG. 2B and FIG. 11, the bridging portion 220 includes an overlapping portion 230 overlapping with an end surface 10 of the dam structure 1 facing the bridging portion 220; and a maximum width Y of the overlapping portion 230 is substantially the same as a maximum width H of the lead portion 210.

Figure 12:
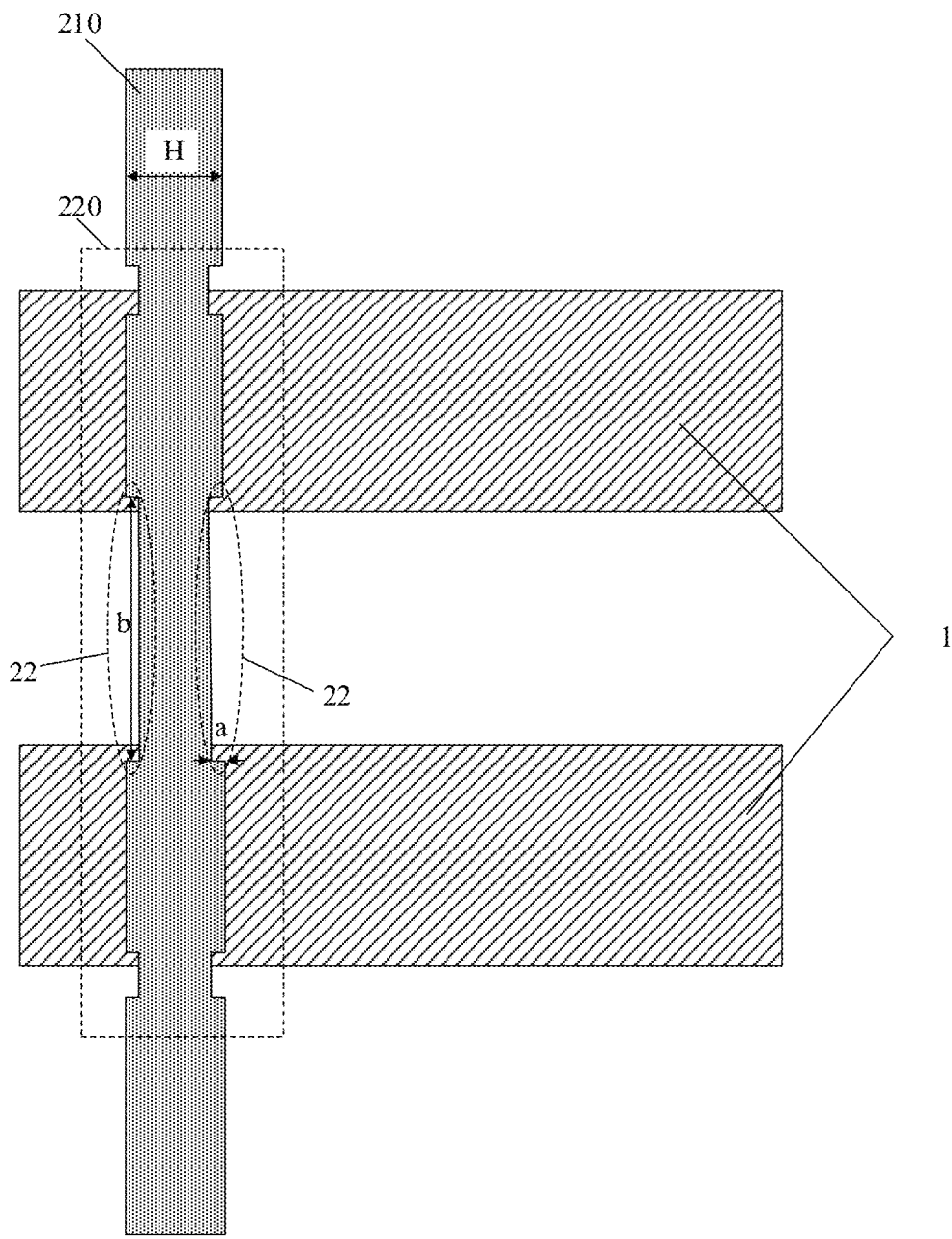
FIG. 12 is a schematic enlarged view of another touch trace structure provided by an embodiment of the disclosure.

During specific implementation, with reference to FIG. 11 and FIG. 12, each touch trace 2 has a cancave portion 22 with an outer edge of the touch trace 2 curved inward at a position between the two adjacent circles of dam structures 1. Specifically, each touch trace 2 has the two cancave portions 22 at the position between the two adjacent circles of dam structures 1, and notches of the two cancave portions 22 are opposite to each other.

During specific implementation, a length b of each cancave portion 22 in the extending direction of the touch trace is greater than a length a in the direction perpendicular to the extending direction of the touch trace. Due to the distance between the two adjacent dam structures 1 is large, the length of the cancave portions 22 in the extending direction of the touch trace is long, but the length a of the cancave portions 22 in the direction perpendicular to the extending direction of the touch trace cannot be too large, since the line width of the touch trace 2 itself is small, if a is large, a sudden change of resistance will be caused.

During specific implementation, between the two adjacent circles of dam structures 1, the hollowed-out portion 21 and the cancave portions 22 communicate. In the embodiment of the disclosure, between the two adjacent circles of dam structures 1, the cancave portions 22 and the hollowed-out portion 21 disposed at the climbing portion are of the same structure, which can simplify the manufacturing difficulty of the touch trace 2 and reduce the manufacturing cost of the display panel.

During specific implementation, the shape of each cancave portion 22 may be a rectangle, a semicircle, a semi-ellipse, a trapezoid, or a triangle.

During specific implementation, the shape of each cancave portion 22 is the rectangle. A length a of each cancave portion 22 in the direction perpendicular to the extending direction of the touch trace 2 is $\frac{1}{10}$ to $\frac{1}{5}$ of the width H of the lead portion 210. In the embodiment of the disclosure, the length a of each cancave portion 22 in the direction perpendicular to the extending direction of the touch trace 2 is $\frac{1}{10}$ to $\frac{1}{5}$ of the width H of the lead portion 210, which can improve the problem of short circuit of the touch trace 2 prone to being occurring between the adjacent dam structures 1, and can also avoid the influence on a signal transmission capability of the touch trace itself when the line width of the touch trace is too narrow.

During specific implementation, the length a of each cancave portion 22 in the direction perpendicular to the extending direction of the touch trace 2 may be 1 μm-3 μm, specifically, for example, may be 2.6 μm. Specifically, the width b of each cancave portion 22 in the extending direction of the touch trace 2 may be 30 μm-45 μm, specifically, for example, may be 37 μm.

Specifically, as shown in FIG. 11, the width H of the lead portion 210 may be 10 μm-45 μm, specifically, for example, may be 14 μm-15 μm, and specifically, for example, may be 14.6 μm. Specifically, the distance k1 between the two adjacent lead portions 210 may be 15 μm-25 μm, and specifically, for example, may be 19 μm.

Specifically, as shown in FIG. 11, the width h of the bridging portion 220 at the climbing portion may be 10 μm-15 μm, and specifically, for example, may be 12 μm. The width p of the bridging portion 220 between the two adjacent dam structures 1 may be specifically 10 μm-15 μm, and specifically, for example, may be 12 μm. Specifically, a distance k2 of the two adjacent bridging portions 220 at the climbing portion may be 20 μm-25 μm, and specifically, for example, may be 21.6 μm.

During specific implementation, as shown in FIG. 11, a width k3 of the dam structure 1 may be 30 μm-40 μm. A distance k4 between the two adjacent dam structures 1 may be 30 μm-40 μm.

During specific implementation, other layers, such as an encapsulation layer and other structures, may further be disposed between the dam structures 1 and the touch trace 2. During specific implementation, the display panel includes: the base substrate, and a thin film transistor, a light-emitting layer and the encapsulation layer located on the base substrate in sequence, where the touch trace is on a side of the encapsulation layer facing away from the light-emitting layer. The dam structures 1 may be located between the light-emitting layer and the encapsulation layer.

An embodiment of the disclosure provides a display device, including the display panel provided by the embodiment of the disclosure.

The embodiments of the disclosure have the following beneficial effects: the display panel provided by the embodiment of the disclosure has the display region and the dam structures surrounding the display region, the display region has the touch electrode, and the touch electrode is led out from the display region through the touch trace across the dam structures. The width of the bridging portion at the climbing portion across the dam structures is less than the width of the lead portion. That is, because when the touch trace enters the display region (AA) from the external circuit (such as FPC), there is the large segment difference when passing through the lower dam structure (Dam), and then when the metal film layer for forming the touch trace is exposed, the slope of the dam structures are prone to being subjected to the photoresist (PR) residue, resulting in the photoresist residue on the steep slopes of the same-film metal lines of the different signals; and after the photoresist is subsequently removed, the metal residue will occur, resulting in the short circuit between the touch traces, which in turn causes the touch failure. However, by reducing the width of the touch trace at the climbing portion across the dam structures, the space between the touch traces at the climbing portion can be increased, the occurrence rate of the short circuit can be reduced, the yield can be improved, and the problem of touch failure due to the short circuit of the adjacent touch traces of the flexible multi-layer on cell can be improved.

What is claimed is:

1. A display panel, comprising:
   a base substrate, having a display region and a peripheral region surrounding the display region;
   a dam structure, disposed on the base substrate and located in the peripheral region, surrounding the display region, and comprising a first dam portion located at at least one side of the display region;
   a touch electrode, at least located in the display region; and
   a touch trace, electrically connected with the touch electrode, and disposed on a side of the dam structure away from the base substrate;
   wherein the touch trace comprises a first trace portion, and an orthographic projection of at least a part of the first trace portion on the base substrate overlaps with an orthographic projection of the first dam portion on the base substrate;
   the first trace portion comprises at least one first trace sub-portion having an average width of a first width, and at least one second trace sub-portion having an average width of a second width, wherein the first width is less than the second width;
   in a direction along an extending direction of the first trace portion, the first dam portion comprises a flat portion and slope portions located at both sides of the flat portion;
   an orthographic projection of the slope portion on the base substrate overlaps with an orthographic projection of the first trace sub-portion on the base substrate,
   the slope portions comprise a first slope sub-portion and a second slope sub-portion, and the second slope sub-portion is located at a side of the first slope sub-portion toward the flat portion and an average slope of the first slope sub-portion is greater than an average slope of the second slope sub-portion; and
   an edge of the orthographic projection of the first dam portion on the base substrate overlaps with the orthographic projection of the first trace sub-portion on the base substrate,
   wherein
   the peripheral region is further provided with fan-out data signal lines, the fan-out data signal lines are electrically connected with data lines of a pixel circuit of the display region, and an orthographic projection of the fan-out data signal lines on the base substrate overlaps with the orthographic projection of the first dam portion on the base substrate;

the orthographic projection of the fan-out data signal lines on the base substrate overlaps with the orthographic projection of the first trace portion on the base substrate, and at least part of extending directions of the fan-out data signal lines intersects extending directions of the first dam portion and the first trace portion.

2. The display panel according to claim 1, wherein a range of a ratio of a minimum distance between the orthographic projection of the first trace sub-portion on the base substrate and the orthographic projection of the first dam portion on the base substrate to a width of the first dam portion is less than 0.5 and greater than or equal to 0.

3. The display panel according to claim 1, wherein an orthographic projection of the flat portion on the base substrate overlaps with an orthographic projection of the second trace sub-portion on the base substrate.

4. The display panel according to claim 1, wherein the second trace sub-portion comprises a first part disposed on the flat portion and a second part disposed on the slope portion, and an average width of the first part is less than an average width of the second part.

5. The display panel according to claim 4, wherein an average width of the first part is 0.8-0.95 times an average width of the second part.

6. The display panel according to claim 1, wherein the first trace sub-portion and the second trace sub-portion are alternately arranged.

7. The display panel according to claim 1, wherein a width of the first trace sub-portion in a direction perpendicular to the extending direction of the first trace portion is 0.6-0.95 times a width of the second trace sub-portion in a direction perpendicular to the extending direction of the first trace portion.

8. The display panel according to claim 1, wherein a boundary of the first trace sub-portion and the second trace sub-portion substantially aligns with a boundary of the first dam portion.

9. The display panel according to claim 1, wherein a range of a ratio of a length of the first trace sub-portion to a width of the first trace sub-portion is approximate to 0.3-0.7.

10. The display panel according to claim 1, wherein a range of a ratio of a length of the first trace sub-portion to a width of the first dam portion is approximate to 0.05-0.3.

11. The display panel according to claim 1, wherein the display panel comprises a plurality of circles of dam structures, and the second trace sub-portion comprises a touch line located between two adjacent dam structures of the plurality of circles of dam structures.

12. The display panel according to claim 1, wherein extending directions of the first dam portion and the first trace portion are substantially vertical.

13. A display panel, comprising:
a base substrate, having a display region and a peripheral region surrounding the display region;
a dam structure, disposed on the base substrate and located in the peripheral region, surrounding the display region, and comprising a first dam portion located at at least one side of the display region;
a touch electrode, at least located in the display region; and
a touch trace, electrically connected with the touch electrode, and disposed on a side of the dam structure away from the base substrate;
wherein the touch trace comprises a first trace portion, and an orthographic projection of at least a part of the first trace portion on the base substrate overlaps with an orthographic projection of the first dam portion on the base substrate;

the first trace portion comprises at least one first trace sub-portion having an average width of a first width, and at least one second trace sub-portion having an average width of a second width, wherein the first width is less than the second width;

in a direction along an extending direction of the first trace portion, the first dam portion comprises a flat portion and slope portions located at both sides of the flat portion;

the slope portions comprise a first slope sub-portion and a second slope sub-portion, and the second slope sub-portion is located at a side of the first slope sub-portion toward the flat portion and an average slope of the first slope sub-portion is greater than an average slope of the second slope sub-portion;

a side of the second trace sub-portion close to the first trace sub-portion has a width gradient; and the width of the second trace sub-portion gradually decreases in a direction from the second trace sub-portion to the first trace sub-portion; and an edge of the orthographic projection of the first dam portion on the base substrate overlaps with an orthographic projection of the first trace sub-portion on the base substrate, wherein the peripheral region is further provided with fan-out data signal lines, the fan-out data signal lines are electrically connected with data lines of a pixel circuit of the display region, and an orthographic projection of the fan-out data signal lines on the base substrate overlaps with the orthographic projection of the first dam portion on the base substrate;

the orthographic projection of the fan-out data signal lines on the base substrate overlaps with the orthographic projection of the first trace portion on the base substrate, and at least part of extending directions of the fan-out data signal lines intersects extending directions of the first dam portion and the first trace portion.

14. A display device, comprising the display panel according to claim 1.

15. The display panel according to claim 13, wherein a range of a ratio of a length of the first trace sub-portion to a width of the first trace sub-portion is approximate to 0.3-0.7.

16. A display device, comprising the display panel according to claim 15.

17. The display panel according to claim 13, wherein a range of a ratio of a length of the first trace sub-portion to a width of the first dam portion is approximate to 0.05-0.3.

18. A display panel, comprising:
a base substrate, having a display region and a peripheral region surrounding the display region;
a dam structure, disposed on the base substrate and located in the peripheral region, surrounding the display region, and comprising a first dam portion located at at least one side of the display region;
a touch electrode, at least located in the display region; and
a touch trace, electrically connected with the touch electrode, and disposed on a side of the dam structure away from the base substrate;
wherein the touch trace comprises a first trace portion, and an orthographic projection of at least a part of the first trace portion on the base substrate overlaps with an orthographic projection of the first dam portion on the base substrate;

the first trace portion comprises at least one first trace sub-portion having an average width of a first width, and at least one second trace sub-portion having an average width of a second width, wherein the first width is less than the second width;

in a direction along an extending direction of the first trace portion, the first dam portion comprises a flat portion and slope portions located at both sides of the flat portion;

an orthographic projection of the slope portion on the base substrate overlaps with the orthographic projection of the first trace sub-portion on the base substrate, the slope portions comprise a first slope sub-portion and a second slope sub-portion, and the second slope sub-portion is located at a side of the first slope sub-portion toward the flat portion and an average slope of the first slope sub-portion is greater than an average slope of the second slope sub-portion; and a range of a ratio of a minimum distance between the orthographic projection of the first trace sub-portion on the base substrate and the orthographic projection of the first dam portion on the base substrate to a width of the first dam portion is less than 0.5 and greater than or equal to 0, wherein the peripheral region is further provided with fan-out data signal lines, the fan-out data signal lines are electrically connected with data lines of a pixel circuit of the display region, and an orthographic projection of the fan-out data signal lines on the base substrate overlaps with the orthographic projection of the first dam portion on the base substrate;

the orthographic projection of the fan-out data signal lines on the base substrate overlaps with the orthographic projection of the first trace portion on the base substrate, and at least part of extending directions of the fan-out data signal lines intersects extending directions of the first dam portion and the first trace portion.

* * * * *